(12) United States Patent
Zou

(10) Patent No.: US 12,016,238 B2
(45) Date of Patent: Jun. 18, 2024

(54) DISPLAY PANEL AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventor: Wei Zou, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 563 days.

(21) Appl. No.: 17/286,464

(22) PCT Filed: Mar. 31, 2021

(86) PCT No.: PCT/CN2021/084274
§ 371 (c)(1),
(2) Date: Apr. 17, 2021

(87) PCT Pub. No.: WO2022/193367
PCT Pub. Date: Sep. 22, 2022

(65) Prior Publication Data
US 2023/0157142 A1      May 18, 2023

(30) Foreign Application Priority Data
Mar. 19, 2021   (CN) .......................... 202110295392.9

(51) Int. Cl.
*H10K 59/80*    (2023.01)
*H10K 59/12*    (2023.01)

(52) U.S. Cl.
CPC ..... *H10K 59/8794* (2023.02); *H10K 59/1201* (2023.02); *H10K 59/12* (2023.02)

(58) Field of Classification Search
CPC ........... H10K 59/8794; H10K 59/1201; H10K 59/12; H10K 59/123; H10K 59/1213;
(Continued)

(56) References Cited

U.S. PATENT DOCUMENTS

2005/0168417 A1* 8/2005 Ha ........................ G09G 3/3233
                                                           345/76
2007/0018916 A1* 1/2007 Kim ...................... G09G 3/3216
                                                           345/76
(Continued)

FOREIGN PATENT DOCUMENTS

CN     105679245 A     6/2016
CN     106782308 A     5/2017
(Continued)

OTHER PUBLICATIONS

Chinese Office Action issued in corresponding Chinese Patent Application No. 202110295392.9 dated Mar. 22, 2022, pp. 1-6.
(Continued)

*Primary Examiner* — Mouloucoulaye Inoussa
(74) *Attorney, Agent, or Firm* — PV IP PC; Wei Te Chung; Zhigang Ma

(57) ABSTRACT

The present invention discloses a display panel and a method for manufacturing the same. The display panel includes a thin film transistor array layer, a light-emitting device layer, and a thermal thin film layer. By means of connecting in series at least one thermistor in a light-emitting loop constituted by a driving transistor and a light-emitting device, the display panel can reduce or elimi-
(Continued)

nate an influence of temperature on an attenuation of luminous brightness, and can meet the industry-recognized life evaluation standards.

14 Claims, 5 Drawing Sheets

(58) Field of Classification Search
CPC ............ H10K 59/131; H10K 59/1216; H10K 59/121; H10K 59/353; H10K 59/122; H10K 59/60; G09G 3/3233; G09G 3/3258; G09G 3/3659; G09G 3/3655; G09G 3/342; G09G 3/3688; G09G 3/32; G09G 2300/0885; G09G 2320/041; G09G 2300/0861; G09G 2320/0209; G09G 2300/0842; G09G 2300/0819; G09G 2320/045; G09G 2320/0233; G09G 2310/0251; G09G 2310/0262; G09G 2320/0257; G09G 2320/0261; G09G 2340/16; G09G 2320/0238; G09G 2320/0252; G09G 2310/024; G09G 2340/02; G09G 2300/0426; G09G 2340/0435; G09G 2300/0443; G09G 2300/0852; G09G 2320/028; G09G 2310/0297; G09G 2310/08; G09G 2360/144; G09G 2300/0439; G09G 2360/142; H01L 27/1222; H01L 27/1255; H01L 27/1225; H01L 27/1251; H01L 27/124; H01L 29/802; H01L 29/165; H01L 29/16; H01L 27/1229; G02F 1/13624; G02F 1/136286; G02F 1/136213; G02F 1/1368; G02F 1/133621; G02F 2202/10; G02F 2201/121; G02F 2201/123
USPC ...... 257/40, E21.616; 438/24, 197; 345/212, 345/82, 76, 309; 315/309; 313/498
See application file for complete search history.

(56) References Cited

U.S. PATENT DOCUMENTS

| | | | |
|---|---|---|---|
| 2008/0030451 A1 | 2/2008 | Tang et al. | |
| 2010/0090931 A1* | 4/2010 | Kawabe | G09G 3/3233 257/E21.616 |
| 2012/0086362 A1* | 4/2012 | Ota | H05B 45/60 313/498 |
| 2014/0204069 A1* | 7/2014 | Chien | G09G 3/3291 345/212 |
| 2015/0282273 A1* | 10/2015 | Ingle | H10N 10/01 257/40 |
| 2015/0317951 A1* | 11/2015 | Genoe | G09G 3/3283 345/82 |
| 2016/0125811 A1* | 5/2016 | Park | G09G 3/3258 345/694 |
| 2017/0141171 A1* | 5/2017 | Johnson | H10K 59/1213 |
| 2018/0006097 A1* | 1/2018 | Xiong | H10K 59/123 |
| 2018/0122872 A1* | 5/2018 | Kim | G01K 1/16 |
| 2018/0308431 A1* | 10/2018 | Hekmatshoartabari | H01L 29/802 |
| 2018/0374910 A1 | 12/2018 | Riedel et al. | |
| 2019/0087046 A1* | 3/2019 | Guo | G06F 3/04166 |
| 2019/0258117 A1* | 8/2019 | Kimura | G09G 3/3659 |
| 2020/0091253 A1* | 3/2020 | Liu | H10K 59/1213 |
| 2020/0168155 A1* | 5/2020 | Xiong | H10K 59/123 |
| 2020/0258950 A1* | 8/2020 | Choi | H01L 29/78648 |
| 2021/0225965 A1* | 7/2021 | Liu | H10K 59/1216 |
| 2021/0232253 A1* | 7/2021 | Cheng | G06F 1/3262 |
| 2021/0405410 A1* | 12/2021 | Wang | G09G 3/3406 |
| 2021/0406505 A1* | 12/2021 | Hai | H04N 25/13 |
| 2021/0407411 A1* | 12/2021 | Yang | G09G 3/3258 |
| 2021/0408095 A1* | 12/2021 | Zhou | H10K 71/00 |
| 2022/0181590 A1* | 6/2022 | Li | H10K 59/126 |
| 2022/0215802 A1* | 7/2022 | Moriya | G09G 3/3275 |

FOREIGN PATENT DOCUMENTS

| | | |
|---|---|---|
| CN | 108615822 A | 10/2018 |
| CN | 110349533 A | 10/2019 |
| CN | 111415975 A | 7/2020 |
| CN | 111755490 A | 10/2020 |
| CN | 111799389 A | 10/2020 |

OTHER PUBLICATIONS

International Search Report in International application No. PCT/CN2021/084274, dated Sep. 28, 2021.
Written Opinion of the International Searching Authority in International application No. PCT/CN2021/084274, dated Sep. 28, 2021.

\* cited by examiner

DISPLAY PANEL AND METHOD FOR MANUFACTURING SAME

RELATED APPLICATIONS

This application is a Notional Phase of PCT Patent Application No. PCT/CN2021/084274 having international filing date of Mar. 31, 2021, which claims the benefit of priority of Chinese Patent Application Nos. 202110295392.9 filed on Mar. 19, 2021. The contents of the above applications are all incorporated by reference as if fully set forth herein in their entirety.

FIELD OF INVENTION

The present invention relates to the field of display technology, in particular, to a display panel and a method for manufacturing the same.

BACKGROUND OF INVENTION

Among organic light-emitting diodes (OLEDs), service life is an important parameter for evaluating a standard of a device. In existing small and medium-sized mass-produced display products, a length of device life is directly related to the service life of the product. A decay curve of organic electro-luminescence (OEL) devices usually consists of a short-term fast decay and a long-term slow decay, and it is an irreversible process. The short-term fast decay can be eliminated by an aging process before delivery, so that only a slow life decay of an electro-luminescence (EL) device is involved in actual use.

However, the life decay of an actual product is not only related to the aging process of the EL. An influence of a bottom thin film transistor (TFT) should also be considered in current mainstream active-matrix organic light-emitting diodes (AMOLEDs). With differences in environments in which mobile phones are used, such as temperature changes, multiple factors will have an impact together. In an early stage of OLED lighting, temperature has an effect on a mobility of TFT and EL devices, causing screen brightness to rapidly decay by 1% to 5%. This phenomenon is called initial drop. Therefore, if an industry-recognized life evaluation standard is used to evaluate, that is, a time it takes for the brightness to decay to 95% of the initial brightness (T95) is used to evaluate, the initial drop will greatly deviate from an actual service life of the EL, which is not conducive to a development of the device and meeting customer needs.

It should be noted that the above introduction of the background technology is only to facilitate a clear and complete understanding of the technical solutions of the present invention. Therefore, it cannot be considered that the above-mentioned technical solutions involved are well-known to those skilled in the art just because it appears in the background art of the present invention.

SUMMARY

The present invention provides a display panel and a method for manufacturing the same, which alleviate a problem of brightness attenuation due to temperature influence during an initial stage of display.

In a first aspect, the present invention provides a display panel comprising a thin film transistor array layer, a light-emitting device layer, a thermal thin film layer, and a pixel driving circuit; the thin film transistor array layer comprises at least one driving transistor; the light-emitting device layer has at least one light-emitting device; the thermal thin film layer has at least one thermistor; and the pixel driving circuit comprises the driving transistor, the thermistor, and the light-emitting device; and the at least one thermistor is connected in series in a light-emitting loop constituted by the driving transistor and the light-emitting device.

In a second aspect, the present invention provides a display panel comprising a thin film transistor array layer, a light-emitting device layer, and a thermal thin film layer; the thin film transistor array layer comprises at least one driving transistor; the light-emitting device layer has at least one light-emitting device; and the thermal thin film layer has at least one thermistor; and the at least one thermistor is connected in series in a light-emitting loop constituted by the driving transistor and the light-emitting device.

Based on the first aspect, in a first embodiment of the first aspect, the thermal thin film layer is disposed adjacent to the thin film transistor array layer or the light-emitting device layer.

Based on the first embodiment of the first aspect, in a second embodiment of the first aspect, the thermal thin film layer is disposed between the thin film transistor array layer and the light-emitting device layer.

Based on the first aspect, in a third embodiment of the first aspect, the display panel further comprises at least one via hole, a first end of the via hole is connected to a first end of the thermistor, a second end of the via hole is connected to one of the driving transistor or the light-emitting device, and the other one of the driving transistor or the light-emitting device is connected to a second end of the thermistor.

Based on the third embodiment of the first aspect, in a fourth embodiment of the first aspect, the light-emitting device layer comprises an anode layer; the anode layer comprises an anode; and a width of the anode is greater than or equal to a width of the thermistor.

Based on the fourth embodiment of the first aspect, in a fifth embodiment of the first aspect, the display panel further comprises a planarization layer, and the planarization layer is disposed between the thin film transistor array layer and the light-emitting device layer.

Based on the fifth embodiment of the first aspect, in a sixth embodiment of the first aspect, the thermal thin film layer is disposed between the planarization layer and the thin film transistor array layer.

Based on the fifth embodiment of the first aspect, in a seventh embodiment of the first aspect, the thermal thin film layer is disposed between the planarization layer and the light-emitting device layer; and the via hole is at least defined in the planarization layer.

Based on the third embodiment of the first aspect, in an eighth embodiment of the first aspect, the thermistor at least partially covers the first end of the via hole or the second end of the via hole.

In a third aspect, the present invention provides a method for manufacturing a display panel, which comprises steps of: forming a thin film transistor array layer, wherein the thin film transistor array layer comprises at least one driving transistor; forming at least one thermal thin film layer, wherein the thermal thin film layer comprises at least one thermistor; forming a light-emitting device layer, wherein the light-emitting device layer comprises at least one light-emitting device; and connecting in series the at least one thermistor in a light-emitting loop constituted by the driving transistor and the light-emitting device.

By means of connecting in series at least one thermistor in a light-emitting loop constituted by the driving transistor and the light-emitting device, the display panel and the method for manufacturing the same provided in the present invention can reduce or eliminate an influence of temperature on an attenuation of luminous brightness, can meet the industry-recognized life evaluation standards, and is conducive to meeting customer needs.

DETAILED DESCRIPTION OF EMBODIMENTS

To make the objectives, technical solutions, and effects of the present invention more clear and specific, the present invention is described in further detail below with reference to the embodiments accompanying with drawings. It should be understood that the specific embodiments described herein are merely for explaining the present invention, and the present invention is not limited thereto.

Figure 1:
FIG. 1 is a schematic structural view of a display panel in accordance with an embodiment of the present invention.
Figure 2:
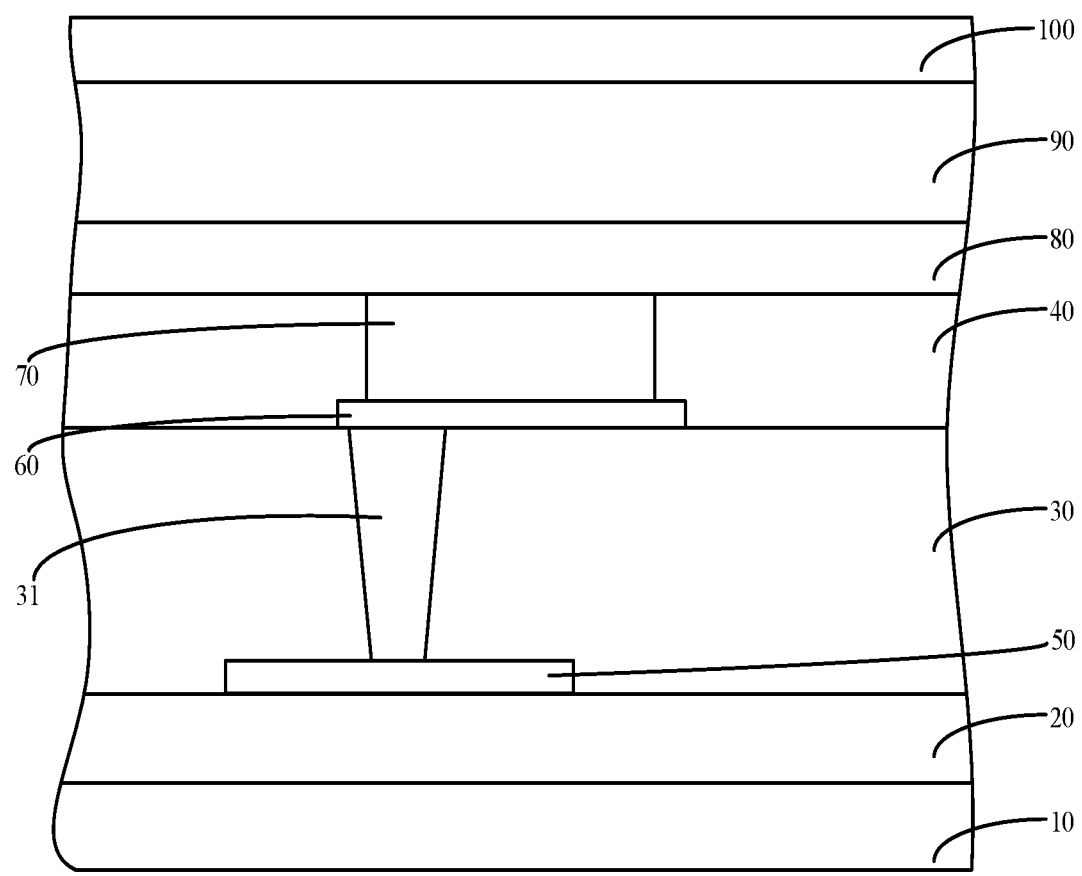
FIG. 2 is another schematic structural view of a display panel in accordance with an embodiment of the present invention.

Referring to FIGS. 1-2, as shown in FIG. 1, this embodiment provides a display panel comprising a thin film transistor array layer 20, a light-emitting device layer 70, and a thermal thin film layer 50; the thin film transistor array layer 20 comprises at least one driving transistor; the light-emitting device layer 70 has at least one light-emitting device; and the thermal thin film layer 50 has at least one thermistor; and the at least one thermistor is connected in series in a light-emitting loop constituted by the driving transistor and the light-emitting device.

It should be noted that studies found that an initial drop has a greater relationship with screen temperature. Therefore, a brightness of the light-emitting screen will rapidly decay in the initial stage of lighting, which will cause a life specification of the display product to be substandard. In order to solve this problem, this embodiment proposes a design of the initial drop, in which a thermistor is connected in series in a loop where the EL device is located, and a temperature sensitivity of the thermistor is used to compensate a current, thereby realizing a compensation of a corresponding brightness, and solving a process limitation and yield loss caused by life issues.

For example, when the light-emitting device is in the initial stage of operation, the temperature rise causes the current flowing through the light-emitting device to drop rapidly. At this time, the thermistor will decrease in resistance as the temperature rises, which indirectly increases a cross voltage between a source electrode and a drain electrode of the driving transistor, that is, Vds of the driving transistor, and further increases the current flowing through the light-emitting device and compensates for the decrease in brightness due to temperature. Conversely, when the temperature drops, a corresponding brightness compensation can also be performed.

Based on the above analysis, this embodiment adds an external structure without changing manufacturing process conditions of the light-emitting device layer 70 and the thin film transistor array layer 20, and it can be applied to various light-emitting material systems and OLED device structures.

It could be understood that by means of connecting in series at least one thermistor in a light-emitting loop constituted by the driving transistor and the light-emitting device, the display panel provided in the present invention can reduce or eliminate an influence of temperature on an attenuation of luminous brightness, can meet the industry-recognized life evaluation standards, and is conducive to meeting customer needs.

In one of the embodiments, the thermal thin film layer 50 is disposed between the thin film transistor array layer 20 and the light-emitting device layer 70.

In one of the embodiments, the display panel further comprises at least one via hole 31, a first end of the via hole 31 is connected to a first end of the thermistor, a second end of the via hole 31 is connected to one of the driving transistor or the light-emitting device, and the other one of the driving transistor or the light-emitting device is connected to a second end of the thermistor.

The via hole 31 may be at least defined in a planarization layer 30, and the via hole 31 is used to realize an electrical connection between the thermistor and the driving transistor DTFT and/or the light-emitting device OLED. Therefore, based on a function of the via hole 31, the via hole 31 may also pass through other film layers in the display panel.

In one of the embodiments, the light-emitting device layer 70 comprises an anode layer 60; the anode layer 60 comprises an anode; and a width of the anode is greater than or equal to a width of the thermistor.

In one of the embodiments, the thermal thin film layer 50 is disposed between the thin film transistor array layer 20 and the anode layer 60.

The thin film transistor array layer 20 may comprise a source and drain layer, and the source and drain layer comprises a source electrode and a drain electrode of the driving transistor DTFT. The thermistor R may be electrically connected to one of the source electrode or the drain electrode of the driving transistor DTFT. Alternatively, the thermistor R can also be electrically connected to the anode of the light-emitting device.

In one of the embodiments, the display panel comprises a planarization layer 30; the planarization layer 30 is disposed between the thin film transistor array layer 20 and the light-emitting device layer 70.

It can be understood that the source and drain layer may be disposed adjacent to the planarization layer 30. A depth of the via hole 31 can be reduced.

In one of the embodiments, the thermal thin film layer 50 is disposed between the planarization layer 30 and the light-emitting device layer 70. The thermal thin film layer 50 is disposed adjacent to the light-emitting device layer 70.

In one of the embodiments, the display panel further comprises at least one of a substrate 10 and an encapsulation layer. The substrate 10 is located on a side of the thin film transistor array layer 20 and away from the planarization layer 30. The encapsulation layer is located on a side of the light-emitting device layer 70 and away from the substrate 10.

The substrate 10 may be, but is not limited to, a glass substrate, and may also be a flexible polyimide (PI) substrate.

In one of the embodiments, on the display panel, a pixel defining layer 40, the anode layer 60, and the light-emitting device layer 70 may be sequentially disposed on a side of the planarization layer 30. A plurality of light-emitting devices may be formed in the light-emitting device layer 70, and at least one light-emitting device may comprise a hole injection layer (HITL), a hole transport layer (HTL), an electron blocking layer (EBL), a blue light-emitting layer (EML), a hole blocking layer (HBL), an electron transport layer (ETL), an electron injection layer (EIL), a cathode, and a light extraction layer (CPL) disposed sequentially.

In one of the embodiments, the encapsulation layer may comprise a first inorganic layer 80, an organic layer 90, and a second inorganic layer 100 that are laminated in sequence. Materials of the first inorganic layer 80 and the second inorganic layer 100 can be any one of silicon nitride, silicon oxide, or silicon oxynitride.

In one of the embodiments, the thermal thin film layer 50 can be formed using at least one method such as evaporation, magnetron sputtering, laser deposition, and etching. A material of the thermal thin film layer 50 may include, but is not limited to, inorganic materials such as MnCoNiO-based material and MnCoCuO-based material. It can also choose positive temperature coefficient (PTC) materials according to a current rise caused by temperature rise when the light-emitting device is working; conversely, negative temperature coefficient (NTC) materials can also be chosen.

Specifically, taking NTC materials as an example, when the device is in the initial stage of operation, the temperature rise causes the current to drop rapidly, the thermistor will decrease in resistance as the temperature rises, which indirectly increases a cross voltage Vds of the driving transistor, and further increases the current and compensates for the decrease in brightness due to temperature.

The thermal thin film layer 50 may be, but is not limited to, translucent. A choice of transparency of the thermal thin film layer 50 can be achieved by adjusting its thickness. It can be understood that a resistance of the thermistor can also be selected according to at least one of the thickness of the thermal thin film layer 50, a shape and size of the thermistor, or other parameters.

In one of the embodiments, the thermal thin film layer 50 comprises a first thermal thin film layer and a second thermal thin film layer. The first thermal thin film layer may be disposed between the planarization layer and the anode layer. The second thermal thin film layer may be disposed between the planarization layer and the thin film transistor array layer. The first thermal thin film layer is formed with a plurality of first thermistors; and the second thermal thin film layer is formed with a plurality of second thermistors. The first thermistor may at least partially cover one of the first end of the via hole or the second end of the via hole. The second thermistor may at least partially cover the other one of the first end of the via hole or the second end of the via hole.

As shown in FIG. 2, in one of the embodiments, the thermal thin film layer 50 is disposed between the planarization layer 30 and the thin film transistor array layer 20. The thermal thin film layer 50 is disposed adjacent to the thin film transistor array layer 20.

As shown in FIG. 1 and FIG. 2, in one of the embodiments, the thermistor at least partially covers the first end of the via hole 31 or the second end of the via hole 31.

It can be understood that the display panel further comprises a pixel circuit, the pixel circuit comprises a corresponding driving transistor, and the driving transistor is located in the thin film transistor array layer 20.

Figure 3:
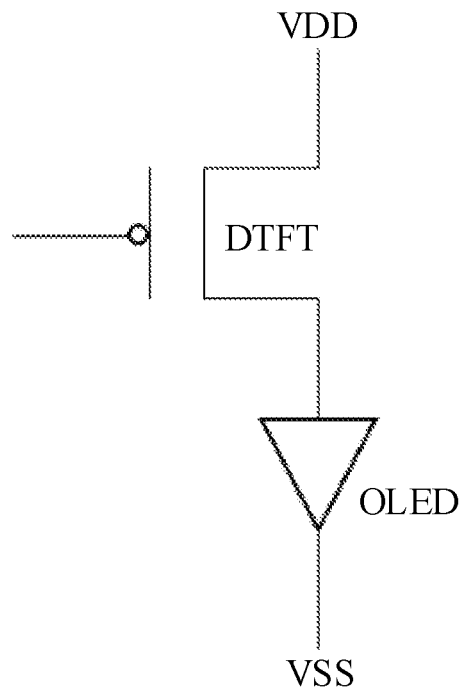
FIG. 3 is a schematic view of a structure of a pixel circuit in a conventional technical solution.

Based on the above technology, in one of the embodiments, as shown in FIG. 3, the pixel circuit may include a driving transistor DTFT and a light-emitting device OLED. One of the source electrode or the drain electrode of the driving transistor DTFT is used to connect to a first power signal VDD; the other one of the source electrode or the drain electrode of the driving transistor DTFT is connected to the anode of the light-emitting device OLED; the cathode of the light-emitting device OLED is used to connect to a second power signal VSS; and a gate electrode of the driving transistor DTFT is used to connect to scan signals. A potential of the first power signal VDD is higher than a potential of the second power signal VSS.

Figure 4:
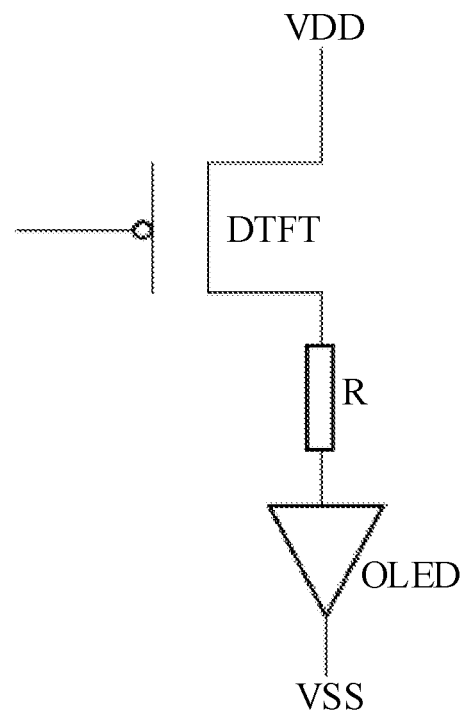
FIG. 4 is a schematic structural view of a pixel circuit in accordance with an embodiment of the present invention.

In one of the embodiments, as shown in FIG. 4, the pixel circuit may include a driving transistor DTFT, a light-emitting device OLED, and a thermistor R. One of the source electrode or the drain electrode of the driving transistor DTFT is used to connect to a first power signal VDD; the other one of the source electrode or the drain electrode of the driving transistor DTFT is connected to a first end of the thermistor R; a second of the thermistor R is connected to the anode of the light-emitting device OLED; the cathode of the light-emitting device OLED is used to connect to a second power signal VSS; and a gate electrode of the driving transistor DTFT is used to connect to scan signals. A potential of the first power signal VDD is higher than a potential of the second power signal VSS.

It can be understood that, compared with the pixel circuit shown in FIG. 3, the pixel circuit shown in FIG. 4 is connected in series with a thermistor R in the light-emitting circuit constituted by the driving transistor DTFT and the light-emitting device OLED. The thermistor R can be used to sense the temperature of the driving transistor DTFT and/or the light-emitting device OLED.

Based on the pixel circuits shown in FIG. 3 and FIG. 4, the light-emitting life of the two pixel circuits is quite different. Hereinafter, the light-emitting life of the pixel circuit shown in FIG. 3 is illustrated as the light-emitting life before improvement, and the light-emitting life shown in FIG. 4 is illustrated as the light-emitting life after improvement. Specifically, as shown in FIG. 5, for sub-pixels with different colors, there are also differences in their light-emitting life.

Figure 5:
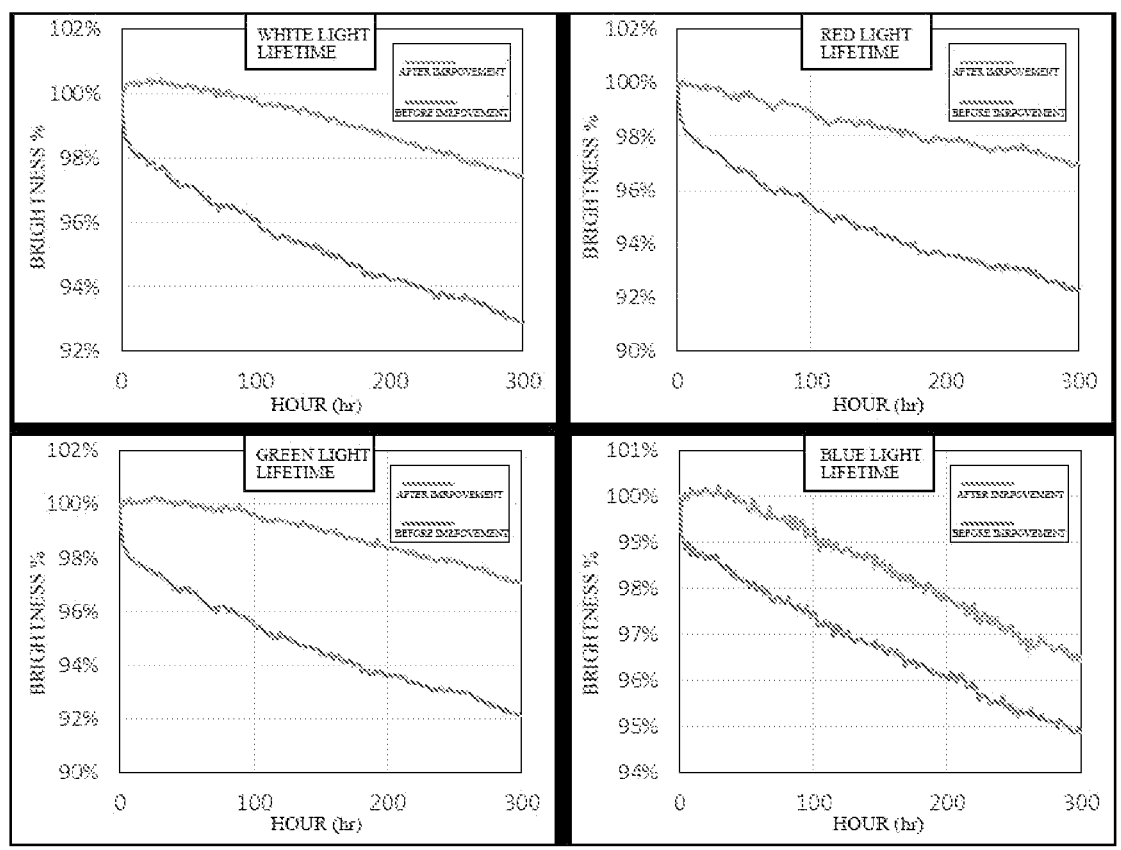
FIG. 5 is a schematic diagram showing a comparison of light-emitting life when different pixel circuits are used.

For example, a small image in the upper left in FIG. 5 is a schematic diagram of white light lifetime comparison of white sub-pixels, the lower curve is a white light lifetime curve before improvement, and the upper curve is a white light lifetime curve after improvement. At a starting point, that is, a horizontal axis of time is 0 hours (hr), an initial brightness of the white light lifetime curve before improvement drops sharply at the beginning, and an initial brightness of the white light lifetime curve after improvement has been further increased at the beginning, and exceeds 100% brightness. At the same time, after comparison, it can be seen that after 300 hours of testing, the brightness of the white light lifetime curve before improvement has decayed to a brightness between 92% and 94% of the initial brightness, while the brightness of the white light lifetime curve after improvement has only decayed to a brightness between 96% and 98% of the initial brightness.

A small image in the upper right in FIG. 5 is a schematic diagram of red light lifetime comparison of red sub-pixels, the lower curve is a red light lifetime curve before improvement, and the upper curve is a red light lifetime curve after improvement. At a starting point, that is, a horizontal axis of time is 0 hours (hr), an initial brightness of the red light lifetime curve before improvement drops sharply at the beginning, and an initial brightness of the red light lifetime curve after improvement drops slowly. After comparison, it can be seen that after 300 hours of testing, the brightness of the red light lifetime curve before improvement has decayed to a brightness between 92% and 94% of the initial brightness, while the brightness of the red light lifetime curve after improvement has only decayed to a brightness between 96% and 98% of the initial brightness.

A small image in the lower left in FIG. 5 is a schematic diagram of green light lifetime comparison of green subpixels, the lower curve is a green light lifetime curve before improvement, and the upper curve is a green light lifetime curve after improvement. At a starting point, that is, a horizontal axis of time is 0 hours (hr), an initial brightness of the green light lifetime curve before improvement drops sharply at the beginning, and an initial brightness of the green light lifetime curve after improvement first rises, and then drops slowly. After comparison, it can be seen that after 300 hours of testing, the brightness of the green light lifetime curve before improvement has decayed to a brightness around 92% of the initial brightness, while the brightness of the green light lifetime curve after improvement has only decayed to a brightness around 97% of the initial brightness.

A small image in the lower right in FIG. 5 is a schematic diagram of blue light lifetime comparison of blue sub-pixels, the lower curve is a blue light lifetime curve before improvement, and the upper curve is a blue light lifetime curve after improvement. At a starting point, that is, a horizontal axis of time is 0 hours (hr), an initial brightness of the blue light lifetime curve before improvement drops sharply at the beginning, and an initial brightness of the blue light lifetime curve after improvement first rises, and then drops slowly. After comparison, it can be seen that after 300 hours of testing, the brightness of the blue light lifetime curve before improvement has decayed to a brightness around 95% of the initial brightness, while the brightness of the blue light lifetime curve after improvement has only decayed to a brightness around 96.5% of the initial brightness.

Based on the above analysis, it can be seen that a use of the pixel circuit provided in the present invention can significantly alleviate the problem of brightness attenuation in the initial stage of light-emitting, and can meet the industry-recognized life evaluation standards.

Figure 6:
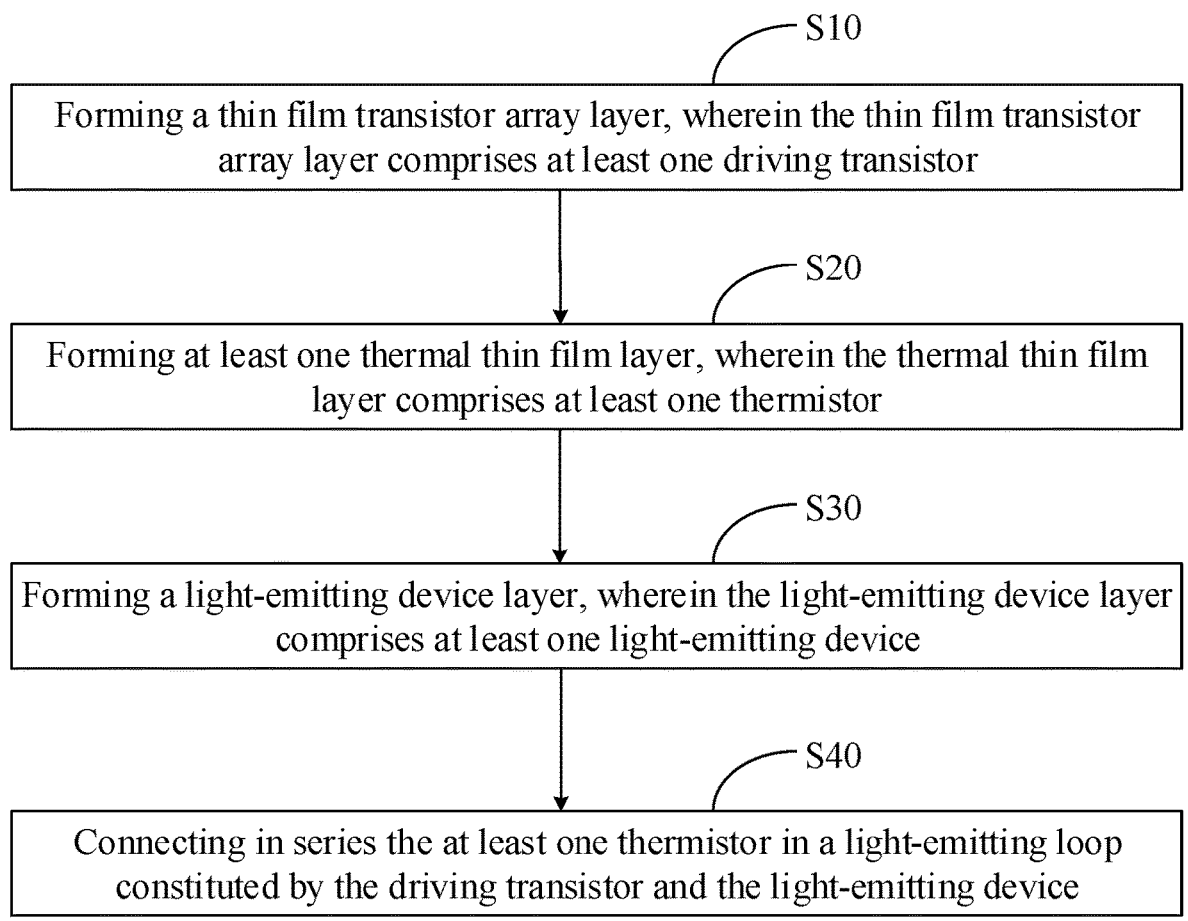
FIG. 6 is a schematic flowchart of a method for manufacturing a display panel in accordance with the embodiments of the present invention.

As shown in FIG. 6, in one of the embodiments, the present invention further provides a method for manufacturing a display panel, which comprises following steps:

Step S10: forming a thin film transistor array layer, wherein the thin film transistor array layer comprises at least one driving transistor.

Step S20: forming at least one thermal thin film layer, wherein the thermal thin film layer comprises at least one thermistor.

Step S30: forming a light-emitting device layer, wherein the light-emitting device layer comprises at least one light-emitting device.

Step S40: connecting in series the at least one thermistor in a light-emitting loop constituted by the driving transistor and the light-emitting device.

It can be understood that, in the method for manufacturing a display panel of this embodiment, the above steps are not strictly executed in order, and methods that can realize the inventive concept of this embodiment can all be applied to a preparation process of the display panel in this embodiment.

It can be understood that, by means of connecting in series at least one thermistor in a light-emitting loop constituted by the driving transistor and the light-emitting device, the method for manufacturing the display panel provided in the present invention can also reduce or eliminate an influence of temperature on an attenuation of luminous brightness, can meet the industry-recognized life evaluation standards, and is conducive to meeting customer needs.

In one embodiment, the present invention further provides a display apparatus comprising the display panel in any of the above embodiments.

It can be understood that, by means of connecting in series at least one thermistor in a light-emitting loop constituted by the driving transistor and the light-emitting device, the display apparatus provided in the present invention can reduce or eliminate an influence of temperature on an attenuation of luminous brightness, can meet the industry-recognized life evaluation standards, and is conducive to meeting customer needs.

It can be understood that, for those skilled in the art, equivalent replacements and modifications can be made according to the technical solution and disclosure ideas thereof of the present invention, and all these modifications or replacements are considered within the protection scope of the attached claims of the present invention.

What is claimed is:

1. A display panel, comprising:
   a substrate;
   a thin film transistor array layer on the substrate, the thin film transistor array layer comprising at least one driving transistor;
   a light-emitting device layer on the thin film transistor array layer, the light-emitting device layer having at least one light-emitting device and an anode layer;
   a thermal thin film layer disposed between the thin film transistor array layer and the light-emitting device layer and having at least one thermistor; and
   a planarization layer disposed between the thin film transistor array layer and the light-emitting device layer and on the thermal thin film layer, wherein a via hole is at least defined in the planarization layer, a first end of the via hole is connected to the thermal thin film layer, an another end of the via hole is connected to the anode layer, an orthographic projection of the anode layer on the substrate at least partially overlaps an orthographic projection of the via hole on the substrate, and an orthographic projection of the thermal thin film layer on the substrate at least partially overlaps an orthographic projection of the via hole on the substrate,
   wherein the at least one thermistor is connected in series in a light-emitting loop constituted by the driving transistor and the light-emitting device.

2. The display panel as claimed in claim 1, wherein the thermal thin film layer is disposed adjacent to the thin film transistor array layer.

3. The display panel as claimed in claim 1, wherein the driving transistor is connected to the thermistor.

4. The display panel as claimed in claim 3, wherein the anode layer comprises an anode; and a width of the anode is greater than or equal to a width of the thermistor.

5. The display panel as claimed in claim 1, wherein the thermal thin film layer is disposed between the planarization layer and the thin film transistor array layer.

6. The display panel as claimed in claim 1, wherein the thermistor at least partially covers the first end of the via hole or the second end of the via hole.

7. A display panel, comprising:
   a substrate;
   a thin film transistor array layer on the substrate, the thin film transistor array layer comprising at least one driving transistor;

a light-emitting device layer on the thin film transistor, the light-emitting device layer having at least one light-emitting device and an anode layer; and a thermal thin film layer having at least one thermistor, a planarization layer disposed between the thin film transistor array layer and the light-emitting device layer, wherein a via hole is at least defined in the planarization layer, an orthographic projection of the anode layer on the substrate at least partially overlaps an orthographic projection of the via hole on the substrate, and an orthographic projection of the thermal thin film layer on the substrate at least partially overlaps an orthographic projection of the via hole on the substrate, wherein the at least one thermistor is connected in series in a light-emitting loop constituted by the driving transistor and the light-emitting device.

8. The display panel as claimed in claim 7, wherein the thermal thin film layer is disposed adjacent to the thin film transistor array layer.

9. The display panel as claimed in claim 7, wherein a first end of the via hole is connected to a first end of the thermistor, a second end of the via hole is connected to the light-emitting device, and the driving transistor is connected to a second end of the thermistor.

10. The display panel as claimed in claim 9, wherein the anode layer comprises an anode; and a width of the anode is greater than or equal to a width of the thermistor.

11. The display panel as claimed in claim 7, wherein the thermal thin film layer is disposed between the planarization layer and the thin film transistor array layer.

12. The display panel as claimed in claim 7, wherein the thermistor at least partially covers the first end of the via hole or the second end of the via hole.

13. The display panel as claimed in claim 7, wherein the thermistor is connected in series between a source electrode of the driving transistor and an anode of the light-emitting device or between a drain electrode of the driving transistor and the anode of the light-emitting device.

14. A method for manufacturing a display panel, comprising steps of:
forming a substrate;
forming a thin film transistor array layer on the substrate, wherein the thin film transistor array layer comprises at least one driving transistor;
forming at least one thermal thin film layer, wherein the thermal thin film layer comprises at least one thermistor;
forming a light-emitting device layer, wherein the light-emitting device layer comprises at least one light-emitting device and an anode layer;
forming a planarization layer between the thin film transistor array layer and the light-emitting device layer and on the thermal thin film layer, wherein a via hole is at least defined in the planarization layer, a first end of the via hole is connected to the thermal thin film layer, an another end of the via hole is connected to the anode layer, an orthographic projection of the anode layer on the substrate at least partially overlaps an orthographic projection of the via hole on the substrate, and an orthographic projection of the thermal thin film layer on the substrate at least partially overlaps an orthographic projection of the via hole on the substrate; and
connecting in series the at least one thermistor in a light-emitting loop constituted by the driving transistor and the light-emitting device.

\* \* \* \* \*